United States Patent
Chiang et al.

(10) Patent No.: US 11,605,406 B2
(45) Date of Patent: Mar. 14, 2023

(54) MEMORY AND SENSE AMPLIFYING DEVICE THEREOF

(71) Applicant: MACRONIX International Co., Ltd., Hsinchu (TW)

(72) Inventors: Yen-Ning Chiang, Taoyan (TW); Shang-Chi Yang, Changhua County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/390,707

(22) Filed: Jul. 30, 2021

(65) Prior Publication Data

US 2023/0033935 A1    Feb. 2, 2023

(51) Int. Cl.
*G11C 7/02*    (2006.01)
*G11C 7/06*    (2006.01)
*G11C 7/12*    (2006.01)

(52) U.S. Cl.
CPC . *G11C 7/06* (2013.01); *G11C 7/12* (2013.01)

(58) Field of Classification Search
CPC .................................. G11C 7/06; G11C 7/12
USPC ........................................................ 365/207
See application file for complete search history.

(56) References Cited

U.S. PATENT DOCUMENTS

| | | | |
|---|---|---|---|
| 6,707,286 B1 * | 3/2004 | Gregoire, Jr. | G05F 3/262 327/543 |
| 7,498,849 B2 * | 3/2009 | Akaogi | H03F 3/45475 327/51 |
| 2009/0153234 A1 | 6/2009 | Bhuiyan | |
| 2020/0234743 A1 * | 7/2020 | Vancha | G11C 7/062 |

FOREIGN PATENT DOCUMENTS

TW    202032550    9/2020

OTHER PUBLICATIONS

Johns et al., "Analog integrated circuit design", John Wiley & Sons, 1997, pp. 144, 354.
"Office Action of Taiwan Counterpart Application", dated Jul. 18, 2022, p. 1-p. 5.

\* cited by examiner

*Primary Examiner* — Tha-O H Bui
(74) *Attorney, Agent, or Firm* — J.C. Patents

(57) ABSTRACT

A sense amplifying device includes a bit line bias voltage adjuster and a sense amplifying circuit. The bit line bias voltage adjuster receives a power voltage to be an operation voltage. The bit line bias voltage adjuster includes a first amplifier, a first transistor and a first current source. The first amplifier, based on the power voltage, generates an adjusted reference bit line voltage according to a reference bit line voltage and a feedback voltage. The first transistor receives the adjusted reference bit line voltage and generates the feedback voltage, wherein the first transistor is a native transistor. The sense amplifying circuit receives the power voltage to be the operation voltage, and generates a sensing result according to the adjusted reference bit line voltage.

16 Claims, 6 Drawing Sheets

MEMORY AND SENSE AMPLIFYING DEVICE THEREOF

BACKGROUND

Technical Field

The disclosure relates to a memory and a sense amplifying device thereof, and more particularly to a memory and a sense amplifying device thereof that can operate normally under a low power voltage.

Description of Related Art

In low-power applications of electronic devices, extremely low power consumption is an important feature for effectively extending the service life of a battery. In an integrated circuit, most of the power consumption occurs in the voltage conversion action generated by the charge pump circuit. Therefore, how to effectively reduce the usage of the charge pump circuit is an important key to reducing power consumption.

In the conventional memory read operation, if the reference bit line voltage is to be effectively adjusted by the bit line regulator in the sense amplifying device, the value of power voltage is usually not high enough under the operation condition of low power voltage. Therefore, in conventional technology, a charge pump circuit is often adopted to increase the power voltage during the read operation, so that the bit line adjuster can maintain normal operation. However, the voltage conversion action performed by the charge pump circuit causes excessive power consumption.

SUMMARY

The disclosure provides a memory and a sense amplifying device thereof. The sense amplifying device can operate normally under low power voltage.

A sense amplifying device of the disclosure includes a bit line bias voltage adjuster and a sense amplifying circuit. The bit line bias voltage adjuster receives a power voltage to be an operation voltage. The bit line bias voltage adjuster includes a first amplifier, a first transistor and a first current source. The first amplifier receives a reference bit line voltage and a feedback voltage. Based on the power voltage, the first amplifier generates an adjusted reference bit line voltage according to the reference bit line voltage and the feedback voltage. The first transistor has a first terminal receiving the power voltage. A second terminal of the first transistor generates the feedback voltage. A control terminal of the first transistor receives the adjusted reference bit line voltage. The first current source is coupled between the second terminal of the first transistor and the reference ground terminal. The sense amplifying circuit receives the power voltage to be the operation voltage, and generates a sensing result according to the adjusted reference bit line voltage.

The memory of the disclosure includes a memory cell array and the sense amplifying device as described above. The sense amplifying device is coupled to the memory cell array to sense the current of the selected memory cell in the memory cell array to generate a sensing result.

Based on the above, for the sense amplifying device of the disclosure, by configuring the first transistor with a low threshold voltage in the bit line bias voltage adjuster, the bit line bias voltage adjuster can generate the effective adjusted reference bit line voltage based on the unboosted power voltage, and the sense amplifying circuit can generate the correct sensing result according to the adjusted reference bit line voltage. In this way, the sense amplifying device can be operated under low power voltage to meet the needs of saving power consumption.

DESCRIPTION OF THE EMBODIMENTS

Figure 1:
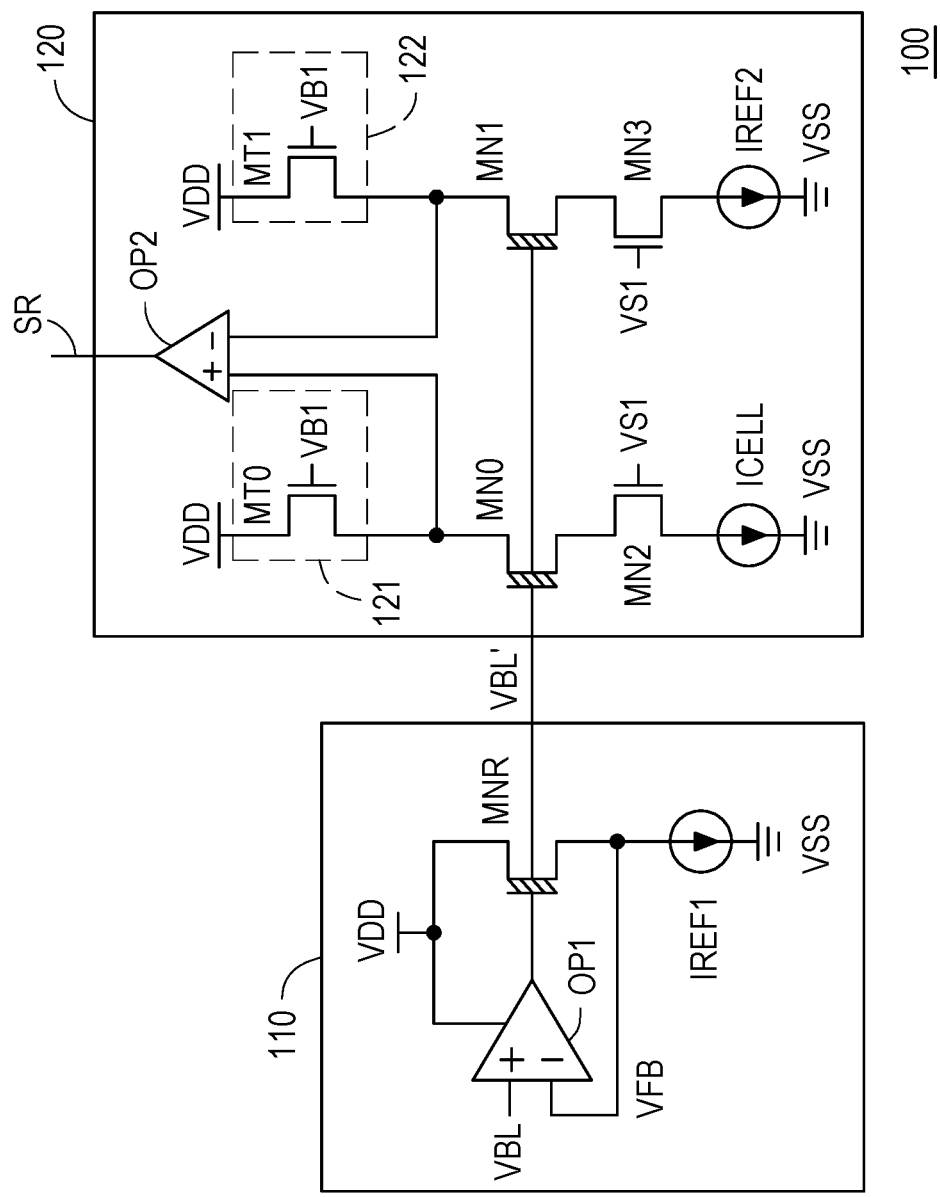
FIG. 1 is a schematic view of a sense amplifying device according to an embodiment of the disclosure.

Please refer to FIG. 1. FIG. 1 is a schematic view of a sense amplifying device according to an embodiment of the disclosure. The sense amplifying device 100 includes a bit line bias voltage adjuster 110 and a sense amplifying circuit 120. The bit line bias voltage adjuster 110 receives a power voltage VDD as the operation voltage. The bit line bias voltage adjuster 110 includes an amplifier OP1, a transistor MNR, and a current source IREF1. The amplifier OP1 receives a reference bit line voltage VBL and a feedback voltage VFB. The amplifier OP1 receives the power voltage VDD as the operation voltage. Based on the power voltage VDD, the amplifier OP1 generates an adjusted reference bit line voltage VBL' according to the reference bit line voltage VBL and the feedback voltage VFB. In detail, the amplifier OP1 may have a positive input terminal to receive the reference bit line voltage VBL and a negative input terminal to receive the feedback voltage VFB. The transistor MNR has a first terminal to receive the power voltage VDD; a second terminal of the transistor MNR generates a feedback voltage VFB; the control terminal of the transistor MNR receives the adjusted reference bit line voltage VBL', and a threshold voltage of the transistor MNR is smaller than a threshold voltage of a normal transistor (equals a standard value). For example, the transistor MNR maybe a native transistor. The current source IREF1 is coupled between the second terminal of the transistor MNR and the reference ground terminal VSS.

In addition, the sense amplifying circuit 120 also receives the power voltage VDD as the operation voltage to generate the sensing result SR according to the adjusted reference bit line voltage VBL'. In this embodiment, the sense amplifying circuit 120 includes current-to-voltage converters 121 and 122, an amplifier OP2, transistors MN0 to MN3, and current sources ICELL and IREF2. One end of the current-to-voltage converter 121 receives the power voltage VDD, and the other end of the current-to-voltage converter 121 is coupled to the first terminal of the transistor MN0. One end of the current-to-voltage converter 122 receives the power voltage VDD, and the other end of the current-to-voltage converter 122 is coupled to the first terminal of the transistor MN1. The transistor MN0, the transistor MN2, and the current source ICELL are connected in series between the current-to-voltage converter 121 and the reference ground terminal VSS in sequence. Specifically, the control terminal of the transistor MN0 receives the adjusted reference bit line voltage VBL', and the transistor MN2 serves as a selection switch and is turned on according to the selection voltage VS1. In addition, the transistor MN1, the transistor MN3, and the current source IREF2 are connected in series between the current-to-voltage converter 122 and the reference ground terminal VSS in sequence. Specifically, the control terminal of the transistor MN1 receives the adjusted reference bit line voltage VBL', and the transistor MN3 serves as a selection switch and is turned on according to the selection voltage VS1. In this embodiment, the current sources ICELL and IREF2 respectively provide the memory cell current and the reference current.

The current-to-voltage converters 121 and 122 can be constructed by transistors MT0 and MT1, respectively. The first terminal of the transistor MT0 receives the power voltage VDD; the second terminal of the transistor MT0 is coupled to the first terminal of the transistor MN0; and the control terminal of the transistor MT0 receives the bias voltage VB1. The first terminal of the transistor MT1 receives the power voltage VDD; the second terminal of the transistor MT1 is coupled to the first terminal of the transistor MN1; and the control terminal of the transistor MT1 receives the bias voltage VB1. In this embodiment, the transistors MT0 and MT1 can both operate in the linear region.

In this embodiment, when the transistors MN2 and MN3 are turned on according to the selection voltage VS1 (under the circumstances, the selection voltage VS1 can be equal to the power voltage VDD), the current-to-voltage converters 121 and 122 generate the first voltage and the second voltage according to the memory cell current and the reference current, respectively. The first voltage and the second voltage are respectively provided to the positive input terminal and the negative input terminal of the amplifier OP2, and the amplifier OP2 generates a sensing result SR according to the comparison of the first voltage and the second voltage.

It should be noted that the transistors MN0 and MN1 and the transistor MNR in this embodiment are also native transistors, and have a relatively low threshold voltage Vth compared to other transistors. In this way, the adjusted reference bit line voltage VBL' can be equal to the reference bit line voltage VBL+Vth. Therefore, in the embodiment of the disclosure, the sense amplifying device 100 can operate under the power voltage VDD with a low voltage value, and there is no need to arrange the charge pump circuit additionally to increase the value of the power voltage VDD. The cost for circuit and power consumption both can be effectively reduced. In other words, the power voltage VDD in the embodiment of the disclosure may be directly provided by a power supply that is not a charge pump circuit.

Figure 2:
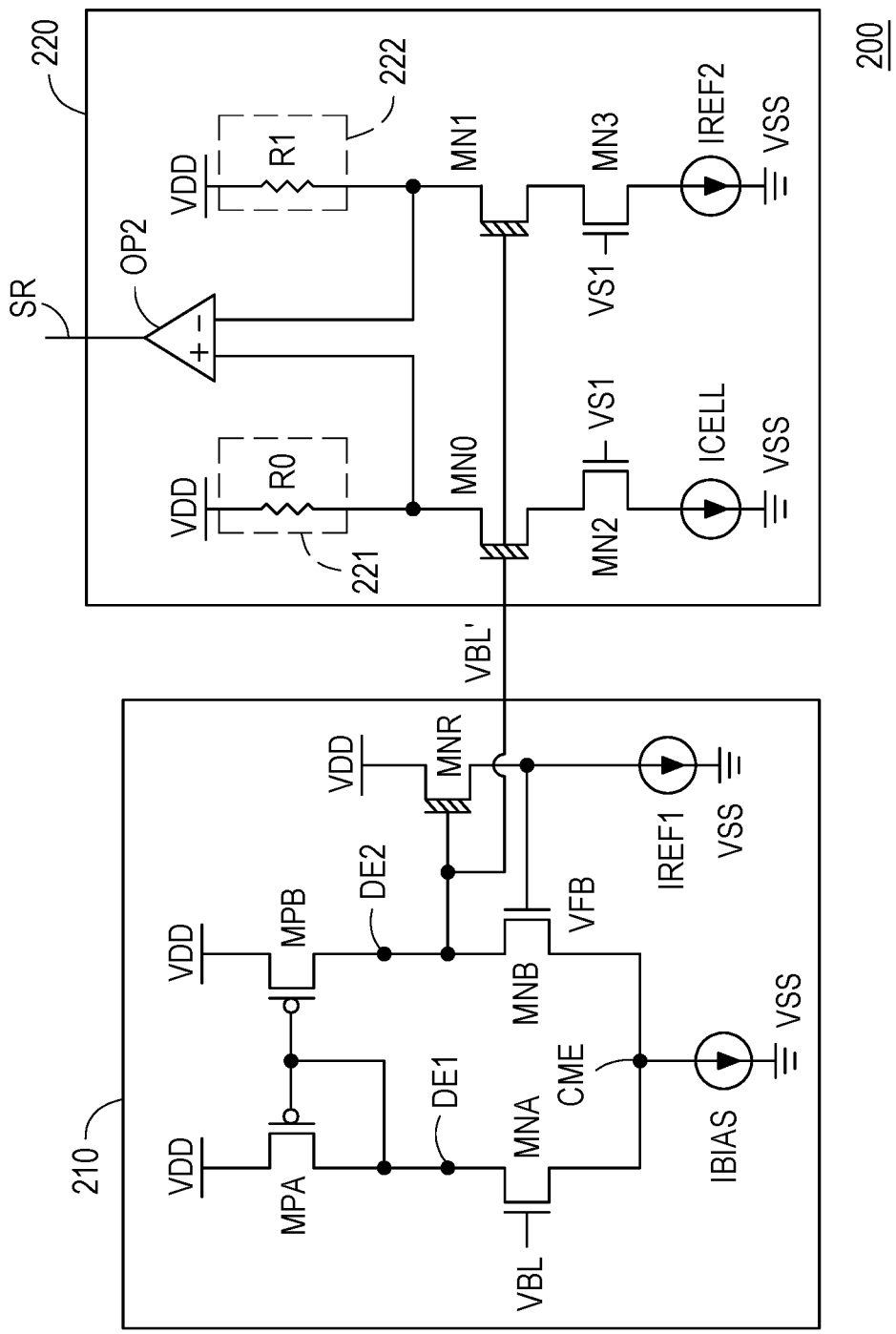
FIG. 2 is a schematic view of a sense amplifying device according to another embodiment of the disclosure.

Please refer to FIG. 2 below. FIG. 2 is a schematic view of a sense amplifying device according to another embodiment of the disclosure. The sense amplifying device 200 includes a bit line bias voltage adjuster 210 and a sense amplifying circuit 220. The bit line bias voltage adjuster 210 includes an amplifier consisting of transistors MPA, MPB, MNA, MNB, and a current source IBIAS, as well as a transistor MNR, and a current source IREF1. In detail, the transistors MNA and MNB form a differential pair, while the transistors MPA and MPB form an active load. The control terminals of the transistors MNA and MNB respectively receive the reference bit line voltage VBL and the feedback voltage VFB, and respectively generate the first current and the second current according to the reference bit line voltage VBL and the feedback voltage VFB. The active load formed by the transistors MPA and MPB is coupled to the two differential terminals DE1 and DE2 of the differential pair. The active load can generate the adjusted reference bit line voltage VBL' at the differential terminal DE2 according to the second current. The current source IBIAS is coupled to the common terminal CME of the differential pair. The current source IBIAS is configured to provide a common current, and the sum of the first current and the second current is equal to the common current provided by the current source IBIAS.

In this embodiment, the sense amplifying circuit 220 includes current-to-voltage converters 221 and 222, the amplifier OP2, the transistors MN0 to MN3, and the current sources ICELL and IREF2. Different from the embodiment in FIG. 1, the current-to-voltage converters 221 and 222 in this embodiment are resistors R0 and R1, respectively. The resistors R0 and R1 can be made of any material that can be used to form resistors in an integrated circuit, such as polysilicon, N-type or P-type doped regions, etc., the disclosure provides no limitation thereto.

It should be noted that in this embodiment, the transistors MPA, MPB, MNA, MNB included in the bit line bias voltage adjuster 210 and the transistor MNR all operate in the saturation region. Moreover, the voltage difference between two ends of each of the transistors MPA, MPB, MNA and MNB can be reduced, and the voltage value required by the power voltage VDD can be decreased. Assuming that a voltage on an end where the transistor MN2 coupled to the transistor MN0 is equal to 0.7 volts, the threshold voltage Vth of the transistor MN0 is equal to 0.2 volts, and the voltage difference between the first terminal and the second terminal of the transistor MPB is equal to 0.1 volts. The bit line bias adjuster device 210 can operate normally as long as the power voltage VDD is slightly greater than 1 volts. In addition, the amplifier in the bit line bias voltage adjuster 210 can also adopt different circuits, but can be constructed by the amplifier circuit that is commonly known to those with ordinary knowledge in the art, and the disclosure provides no limitation thereto. For example, the amplifier in the bit line bias voltage adjuster 210 can also be constructed in a complementary manner through the circuit composed of the transistors MPA, MPB, MNA, MNB, and current source IBIAS in FIG. 2.

The details of operation of the sense amplifying circuit 220 are similar to those of the sense amplifying circuit 120 in the embodiment of FIG. 1. Therefore, no further description is incorporated herein.

Figure 3:
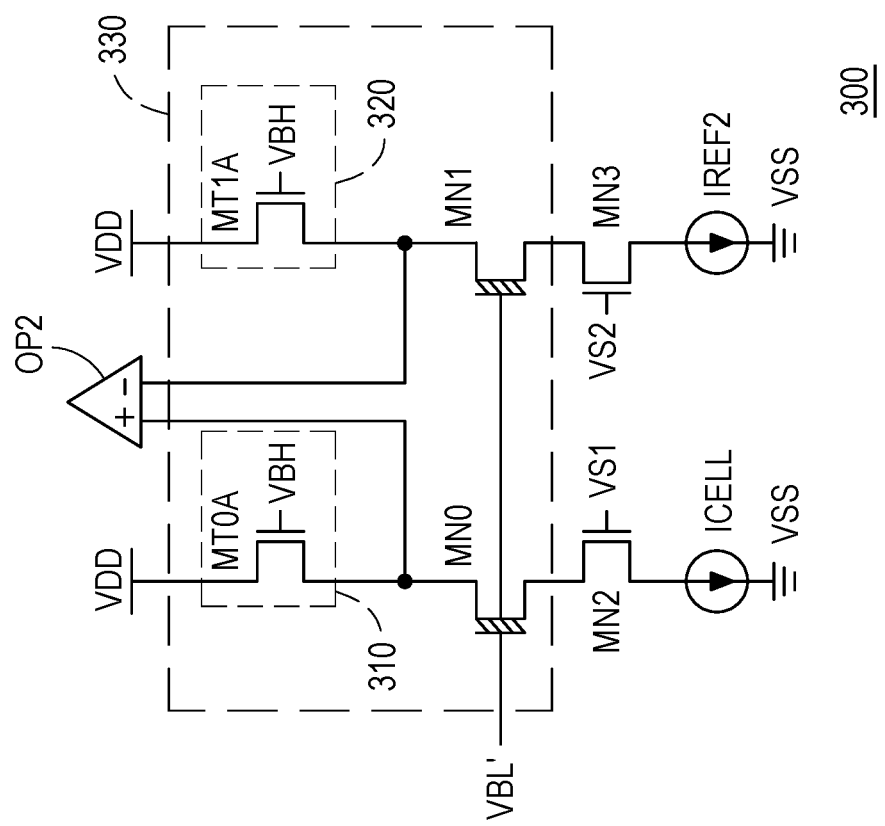
FIG. 3 is a schematic view of another implementation of a sense amplifying circuit in a sense amplifying device according to an embodiment of the disclosure.

Please refer to FIG. 3 below. FIG. 3 is a schematic view of another implementation of a sense amplifying circuit in a sense amplifying device according to an embodiment of the disclosure. The sense amplifying circuit 300 includes current-to-voltage converters 321 and 322, an amplifier OP2, transistors MN0 to MN3, and current sources ICELL and IREF2. Different from the sense amplifying circuit 220 in FIG. 2, the current-to-voltage converters 321 and 322 in this embodiment are constructed by transistors MT0A and MT1A, respectively. Specifically, the voltage endurance of the transistors MT0A and MT1A is higher than the voltage endurance of the transistors MT0 and MT1 in the sense amplifying circuit 220. Moreover, the transistors MT0A and MT1A in this embodiment are controlled by the bias voltage VBH. The bias voltage VBH received by the transistors MT0A and MT1A may be greater than the bias voltage VB1 received by the transistors MT0 and MT1.

Figure 4:
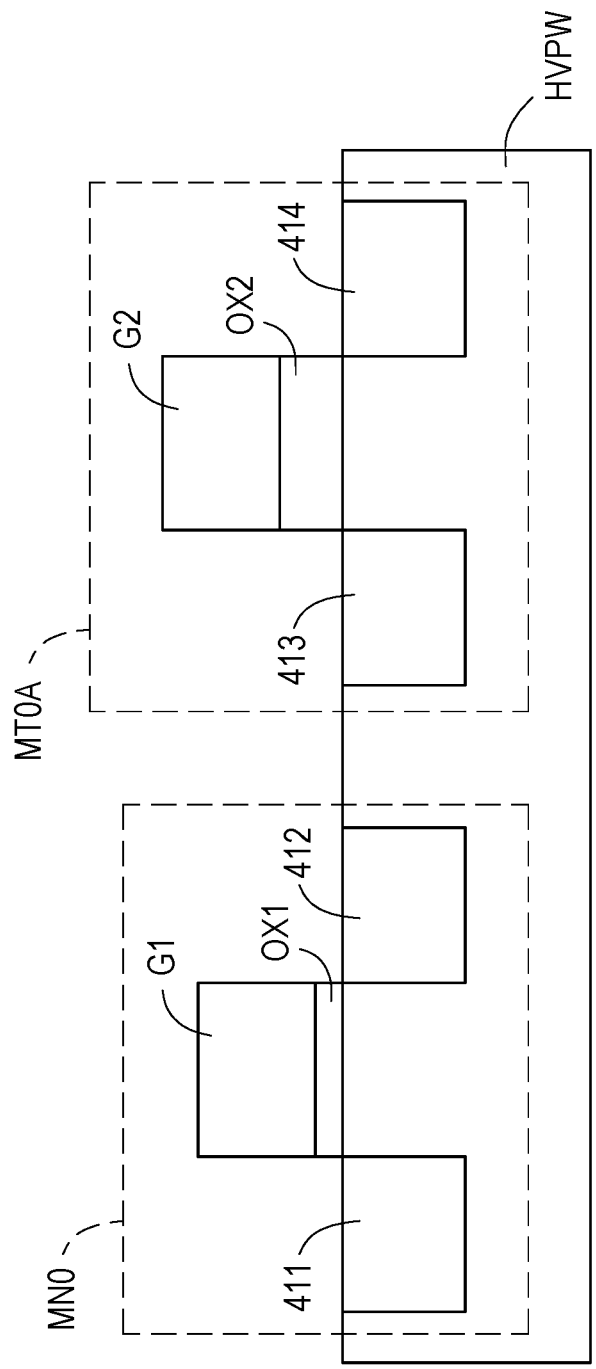
FIG. 4 is a schematic partial cross-sectional view of a structure of a sense amplifying circuit according to an embodiment of the disclosure.

It should be mentioned that in this embodiment, the transistors MT0A and MT1A and the transistors MN0 and MN1 can all be arranged in the same well. Please refer to FIG. 4 together. FIG. 4 is a schematic partial cross-sectional view of a structure of a sense amplifying circuit according to an embodiment of the disclosure. In FIG. 4, the transistors MN0 and MT0A are both set in the well HVPW. Taking the well HVPW as a P-type well as an example, doped regions 411, 412, 413, and 414 can be provided in the well HVPW. The gate structure G1 and the oxide layer OX1 respectively cover between the doped regions 411 and 412, and form the transistor MN0. The gate structure G2 and the oxide layer OX2 respectively cover between the doped regions 413 and 414, and form the transistor MTOA. The doped region 411 may be the source (or drain) of the transistor MN0, and the doped region 412 may be the drain (or source) of the transistor MN0. The doped region 413 may be the source (or drain) of the transistor MTOA, and the doped region 414 may be the drain (or source) of the transistor MTOA.

In this embodiment, the thickness of the oxide layer OX2 may be greater than the thickness of the oxide layer OX1. In the embodiment of the disclosure, by arranging the transistors MT0A and MT1A and the transistors MN0 and MN1 in the same well, the area required for the circuit layout can be effectively reduced.

Figure 5:
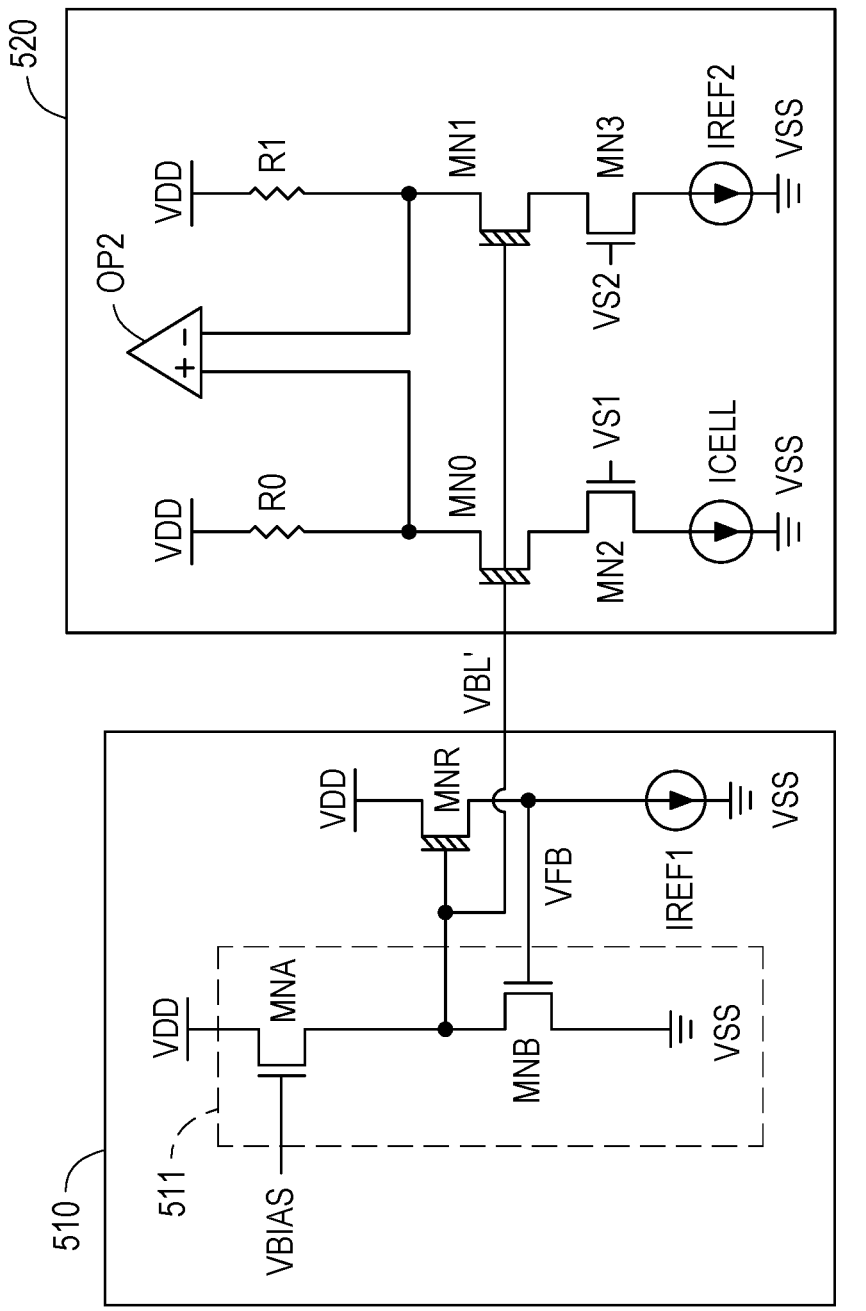
FIG. 5 is a schematic view of a sense amplifying device according to another embodiment of the disclosure.

Please refer to FIG. 5 below. FIG. 5 is a schematic view of a sense amplifying device according to another embodiment of the disclosure. The sense amplifying device 500 includes a bit line bias voltage adjuster 510 and a sense amplifying circuit 520. In this embodiment, the circuit structure of the sense amplifying circuit 520 is the same as the circuit structure of the sense amplifying circuit 220 in FIG. 2, and no further description is incorporated herein. The bit line bias voltage adjuster 510 in this embodiment includes an amplifier 511, a transistor MNR, and a current source IREF1. The amplifier 511 includes a transistor MNA and MNB. The first terminal of the transistor MNA receives the power voltage VDD, the control terminal of the transistor MNA receives the bias voltage VBIAS, the second terminal of the transistor MNA is coupled to the first terminal of the transistor MNB, and generates the adjusted reference bit line voltage VBL'. The second terminal of the transistor MNB is coupled to the reference ground voltage VSS, and the control terminal of the transistor MNB receives the feedback voltage. In this embodiment, the bias voltage VBIAS is related to the reference bit line voltage.

The adjusted reference bit line voltage VBL' is provided to the control terminal of the transistor MNR. The first terminal of the transistor MNR receives the power voltage VDD, and the current source IREF1 is connected in series between the second terminal of the transistor MNR and the reference ground terminal VSS.

In this embodiment, the transistor MNR is a native transistor, and the turn-on voltage of the transistor MNR can be lower than the turn-on voltage of the transistors MNA and MNB.

Figure 6:
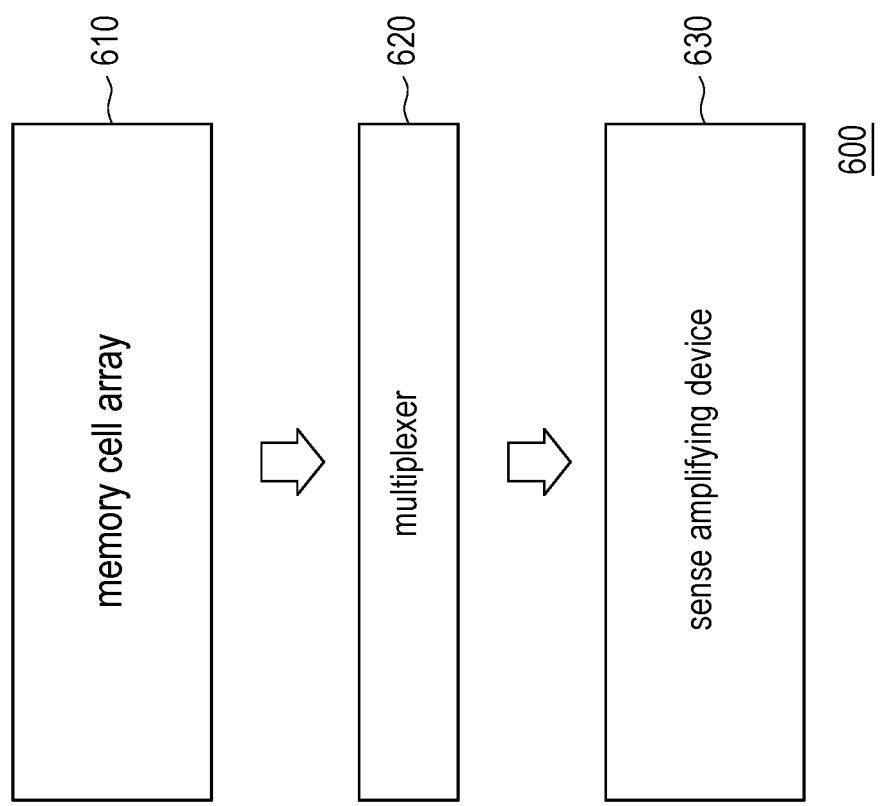
FIG. 6 is a schematic view of an implementation of a memory according to an embodiment of the disclosure.

Please refer to FIG. 6. FIG. 6 is a schematic view of an implementation of a memory according to an embodiment of the disclosure. The memory 600 includes a memory cell array 610, a multiplexer 620, and a sense amplifying device 630. The memory cell array 610 is coupled to the sense amplifying device 630 through the multiplexer 620. The sense amplifying device 630 can be implemented by using the sense amplifying device 100, 200, or 500 of the foregoing embodiment. The memory cell array 610 can be a static random-access memory cell array, a dynamic random-access memory cell array, a flash memory cell array, a resistive random-access memory (ReRAM) array, a phase change random-access memory (PCRAM) array or a magnetoresistive random-access memory (MRAM) array.

The sense amplifying device 630 in the embodiment of the disclosure can directly receive the power voltage provided by the power generator that is not a charge pump circuit as the operation voltage, and correctly sense the read information of the memory cell array 610, so that the required power consumption can be effectively reduced.

In summary, the disclosure constructs a bit line bias voltage adjuster through the use of native transistors. In this way, the bit line bias voltage adjuster can receive the power voltage that does not need to be boosted as the operation voltage, and effectively generate the adjusted reference bit line voltage. The sense amplifying circuit can perform the sensing operation on the memory cell current according to the adjusted reference bit line voltage and generate the sensing result. In this way, the sense amplifying device can operate normally under low power voltage conditions, which can effectively reduce the required power consumption.

What is claimed is:

1. A sense amplifying device, comprising:
a bit line bias voltage adjuster, which receives a power voltage as an operation voltage, and the bit line bias voltage adjuster comprising:
 a first amplifier that receives a reference bit line voltage and a feedback voltage, and based on the power voltage, generates an adjusted reference bit line voltage according to the reference bit line voltage and the feedback voltage;
 a first transistor that has a first terminal that receives the power voltage, wherein a second terminal of the first transistor generates the feedback voltage, a control terminal of the first transistor receives the adjusted reference bit line voltage; and
 a first current source which is coupled between the second terminal of the first transistor and a reference ground terminal; and
a sense amplifying circuit, which receives the power voltage as the operation voltage, and generates a sensing result according to the adjusted reference bit line voltage,
wherein the sense amplifying circuit comprises:
 a first current-to-voltage converter, having a first terminal receiving the power voltage;
 a second current-to-voltage converter, having a first terminal receiving the power voltage;
 a second transistor, coupled between a second terminal of the first current-to-voltage converter and the reference ground terminal, controlled by the adjusted reference bit line voltage;
 a third transistor, coupled between a second terminal of the second current-to-voltage converter and the reference ground terminal, controlled by the adjusted reference bit line voltage;
 a first selection switch, coupled between the second transistor and the reference ground terminal, controlled by a selection voltage;
 a second selection switch, coupled between the third transistor and the reference ground terminal, controlled by the selection voltage;
 a second current source, coupled between the first selection switch and the reference ground terminal, providing a memory cell current;
 a third current source, coupled between the second selection switch and the reference ground terminal, providing a reference current; and a second amplifier, having two input terminals respectively coupled to the second terminal of the first current-to-voltage converter and the second terminal of the second current-to-voltage converter, wherein an output terminal of the second amplifier generates the sensing result.

2. The sense amplifying device according to claim 1, wherein the first amplifier comprises:
a differential pair, receiving the reference bit line voltage and the feedback voltage, and generating a first current and a second current according to the reference bit line voltage and the feedback voltage, respectively;
an active load, coupled to two differential terminals of the differential pair, and generating the adjusted reference bit line voltage according to the second current; and
a fourth current source, coupled to a common terminal of the differential pair to provide a common current, wherein a sum of the first current and the second current is equal to the common current.

3. The sense amplifying device according to claim 2, wherein the differential pair comprises:
a fourth transistor, having a first terminal coupled to a first differential terminal, a second terminal of the fourth transistor coupled to the common terminal, and a control terminal of the fourth transistor receiving the reference bit line voltage; and
a fifth transistor, having a first terminal coupled to a second differential terminal, a second terminal of the fifth transistor coupled to the common terminal, and a control terminal of the fifth transistor receiving the feedback voltage.

4. The sense amplifying device according to claim 3, wherein the active load comprises:
a sixth transistor, having a first terminal receiving the power voltage, a second terminal and a control terminal of the sixth transistor both coupled to the first differential terminal; and
a seventh transistor, having a first terminal receiving the power voltage, a second terminal of the seventh transistor coupled to the second differential terminal, and a control terminal of the seventh transistor coupled to the control terminal of the sixth transistor.

5. The sense amplifying device according to claim 4, wherein the fourth transistor to the seventh transistor all operate in a saturation region.

6. The sense amplifying device according to claim 1, wherein threshold voltages of the second transistor and the third transistor are both smaller than a standard value.

7. The sense amplifying device according to claim 1, wherein the first current-to-voltage converter and the second current-to-voltage converter are a first resistor and a second resistor, respectively.

8. The sense amplifying device according to claim 1, wherein the first current-to-voltage converter and the second current-to-voltage converter are a fourth transistor and a fifth transistor, respectively,
wherein a first terminal of the fourth transistor receives the power voltage, a second terminal of the fourth transistor is coupled to a first terminal of the second transistor, and a control terminal of the fourth transistor receives a bias voltage, a first terminal of the fifth transistor receives the power voltage, a second terminal of the fifth transistor is coupled to a first terminal of the third transistor, and a control terminal of the fifth transistor receives the bias voltage.

9. The sense amplifying device according to claim 8, wherein the fourth transistor and the fifth transistor operate in a linear region.

10. The sense amplifying device according to claim 8, wherein the second transistor to the fifth transistor are arranged in a same well.

11. The sense amplifying device according to claim 8, wherein a thickness of a gate oxide layer of the second transistor and the third transistor is lower than a thickness of a gate oxide layer of the fourth transistor and the fifth transistor.

12. The sense amplifying device according to claim 1, wherein the first amplifier comprises:
a fourth transistor, having a first terminal receiving the power voltage, a second terminal of the fourth transistor generating the adjusted reference bit line voltage, and a control terminal of the fourth transistor receiving a bias voltage, wherein the bias voltage is related to the reference bit line voltage; and
a fifth transistor, having a first terminal coupled to the second terminal of the fourth transistor, wherein a second terminal of the fifth transistor is coupled to the reference ground terminal, and the control terminal of the fourth transistor receives the feedback voltage.

13. The sense amplifying device according to claim 1, further comprising:
a power supply, wherein the power supply is a voltage generator that is not a charge pump circuit.

14. The sense amplifying device according to claim 1, the first transistor has a threshold voltage smaller than a standard value.

15. A memory, comprising:
a memory cell array; and
a sense amplifying device, coupled to the memory cell array and configured for sensing a current of a selected memory cell in the memory cell array to generate a sensing result, wherein the sense amplifying device, comprises:
a bit line bias voltage adjuster, which receives a power voltage as an operation voltage, and the bit line bias voltage adjuster comprising:
a first amplifier that receives a reference bit line voltage and a feedback voltage, and based on the power voltage, generates an adjusted reference bit line voltage according to the reference bit line voltage and the feedback voltage;
a first transistor that has a first terminal that receives the power voltage, wherein a second terminal of the first transistor generates the feedback voltage, a control terminal of the first transistor receives the adjusted reference bit line voltage; and
a first current source which is coupled between the second terminal of the first transistor and a reference ground terminal; and
a sense amplifying circuit, which receives the power voltage as the operation voltage, and generates the sensing result according to the adjusted reference bit line voltage,
wherein the sense amplifying circuit comprises:
a first current-to-voltage converter, having a first terminal receiving the power voltage;
a second current-to-voltage converter, having a first terminal receiving the power voltage;
a second transistor, coupled between a second terminal of the first current-to-voltage converter and the reference ground terminal, controlled by the adjusted reference bit line voltage;

a third transistor, coupled between a second terminal of the second current-to-voltage converter and the reference ground terminal, controlled by the adjusted reference bit line voltage;

a first selection switch, coupled between the second transistor and the reference ground terminal, controlled by a selection voltage;

a second selection switch, coupled between the third transistor and the reference ground terminal, controlled by the selection voltage;

a second current source, coupled between the first selection switch and the reference ground terminal, providing a memory cell current;

a third current source, coupled between the second selection switch and the reference ground terminal, providing a reference current; and a second amplifier, having two input terminals respectively coupled to the second terminal of the first current-to-voltage converter and the second terminal of the second current-to-voltage converter, wherein an output terminal of the second amplifier generates the sensing result.

16. The memory according to claim 15, wherein the memory cell array is a static random-access memory cell array, a dynamic random-access memory cell array, a flash memory cell array, a resistive random-access memory (ReRAM) array, a phase change random-access memory (PCRAM) array or a magnetoresistive random-access memory (MRAM) array.

\* \* \* \* \*